(12) United States Patent
Dariavach et al.

(10) Patent No.: US 7,626,237 B1
(45) Date of Patent: Dec. 1, 2009

(54) NON-VOLATILE MEMS MEMORY CELL AND METHOD OF FORMING SUCH MEMORY CELL

(75) Inventors: Nader G. Dariavach, Middleboro, MA (US); Jin Liang, Southborough, MA (US)

(73) Assignee: EMC Corporation, Hopkinton, MA (US)

( * ) Notice: Subject to any disclaimer, the term of this patent is extended or adjusted under 35 U.S.C. 154(b) by 151 days.

(21) Appl. No.: 11/768,648

(22) Filed: Jun. 26, 2007

(51) Int. Cl.
*H01L 29/78* (2006.01)
(52) U.S. Cl. .................. 257/415; 257/213; 257/418
(58) Field of Classification Search .............. 257/213, 257/415, 418
See application file for complete search history.

(56) References Cited

U.S. PATENT DOCUMENTS 5,619,177 A * 4/1997 Johnson et al. ............. 337/140
6,473,361 B1 * 10/2002 Chen et al. ................. 365/244
6,611,033 B2 * 8/2003 Hsu et al. ................... 257/414

\* cited by examiner

*Primary Examiner*—Douglas M Menz

(57) ABSTRACT

A memory cell for storing a bit having one of two logic states. The memory cell includes a structure comprises a pair of electrically conductive shape memory alloy members separated by a dielectric. An electrical circuit applies a current pulse at a first time to the first electrically conductive member to place the structure is a first position corresponding to one of the two logic states and for applying a current pulse at a different time to change the position of the structure from the first position to a different position, such different position corresponding to a different one of the two logic states. Output circuitry is provided for detecting the logic state of the bit stored by the memory cell, such output circuitry comprising a position sensor for detecting whether the structure is in the first position or in the second position.

2 Claims, 5 Drawing Sheets

NON-VOLATILE MEMS MEMORY CELL AND METHOD OF FORMING SUCH MEMORY CELL

TECHNICAL FIELD

This invention relates generally to non-volatile memory cells and more particularly to micro-electro-mechanical system (MEMS) memory cells.

BACKGROUND

As is known in the art, memory cells are used to store (i.e., read and write) bits of digital words. Non-volatile memory cells are able to store the bit without sustaining electrical power. One type of memory cell is a MEMS memory cell. One such MEMS memory cell is described in U.S. Patent Publication No. 2001/0018461 published Sep. 6, 2001. Such publication describes nanomechanical data storage device called a "Millipede", which is using write/read tips on specific polymer, similar to old punch cards but with ability ability to erase data and rewrite the medium. Such device is relatively complicated in design and manufacturing and the use of a plastic media results in the degradation over time at elevated temperature of rewriting.

Another MEMS memory cell is described in U.S. Pat. No. 7,050,320 issued May 23, 2006, such device having a memory layer and a MEMS layer. The storage medium includes chalcogenide islands as storage elements. The MEMS layer includes a movable MEMS platform having probes to connect selected chalcogenide islands via positioning of the MEMS platform. A high voltage source disposed external to the memory layer and the MEMS layer provides a high voltage to a stator electrode on the memory layer and to a rotor electrode on the MEMS platform to control movement of the MEMS platform with respect to the storage medium.

As is also known in the art, certain alloys known as shape memory alloys (SMA, also known as a smart alloy or memory metal) is an alloy that "remembers" its geometry. After a sample of SMA has been deformed from its original crystallographic configuration, it regains its original geometry by itself during heating (one-way effect) or, at higher ambient temperatures, simply during unloading (pseudo-elasticity or superelasticity). These extraordinary properties are due to a temperature-dependent martensitic phase transformation from a low-symmetry to a highly symmetric crystallographic structure. Those crystal structures are known as martensite (at lower temperatures) and austenite (at higher temperatures). One type of SMA is Nitinol is a Nickel-Titanium alloy with shape memory properties. It was discovered at the Naval Ordnance Laboratory and was released for public in 1961. Nitinol has super-plasticity and shape memory. Below the critical temperature (critical temperature depend on alloy composition), the alloy is flexible and can be bent easily into any shape. This is known as the martensitic state, where atoms are in flexible lattices, which allow the metal to be bent easily. When alloy is heated to the temperature of transformation to austenitic state, it restores the original shape, known as 'heat memory', where atoms become locked into their previous rigid arrangement. In our case, when Nitinol memory tip's actuator is heated by electric current into the austenitic phase, the alloy recovers its initial shape.

Shape memory alloys find wide application in the design of solar panels on some satellites where they are raised into position by Shape Memory Alloys (SMA), activated by the heat of the sun. Another, more simple but more exciting examples of Nitinol application is metal-bending trick produced by psychic-magicians. For example, silver plated Nitinol spoon can change its shape by application of heat corresponded by fingers. Additional information about shape memory alloys can be found at http://www.stanford.edu/~richlin1/sma/sma.html.

SUMMARY

In accordance with the invention, a memory cell for storing a bit having one of two logic states. The memory cell includes a structure comprising: a first electrically conductive member comprising a shape memory alloy; a second electrically conductive member comprising a shape memory alloy; and a dielectric disposed between the first electrically conductive member and the second electrically conductive member. An electrical circuit is provided for applying a current pulse at a first time to the first electrically conductive member to place the structure is a first position corresponding to one of the two logic states and for applying a current pulse at a different time to change the position of the structure from the first position to a different position, such different position corresponding to a different one of the two logic states. Output circuitry is provided for detecting the logic state of the bit stored by the memory cell, such output circuitry comprising a position sensor for detecting whether the structure is in the first position or in the second position.

In one embodiment, the structure is a cantilevered structure having a fixed proximal end and a pivotal distal end and wherein the position of the structure is changed by the distal end pivoting between the first position and the different position.

In accordance with another feature of the invention, a method is provided for forming a memory cell for storing a bit having one of two logic states. The method includes forming a structure comprising: a first electrically conductive member comprising a shape memory alloy; a second electrically conductive member comprising a shape memory alloy; an electrically and thermally insulating dielectric disposed between the first electrically conductive member and the second electrically conductive member. The structure is placed in a first position corresponding to one of the two logic states. The first electrically conductive member is heated while the structure is in the first position. The applied heat is removed from the first electrically conductive member. The position of the structure is changed from the first position to a different position corresponding to a second one of the two logic states. The second electrically conductive member is heated while the structure is in the second position. The applied heat is removed from the second electrically conductive member.

In one embodiment, the structure is formed as a cantilevered structure having a fixed proximal end and a pivotal distal end and wherein the position of the structure is changed by the distal end pivoting between the first position and the different position.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
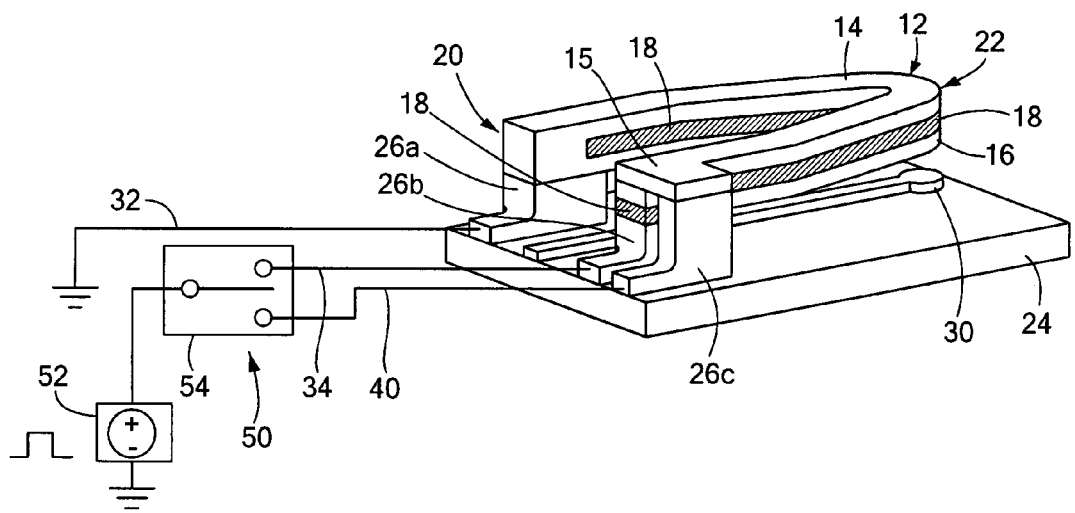
FIGS. 1A-1F are sketches of steps used in the manufacture of a memory cell in accordance with the invention.

Referring now to FIGS. 1A-1F, the process used to for a memory cell 10 (FIG. 2) is shown. The memory cell 10 is used for storing a bit having one of two logic states. The memory cell 10 includes a structure 12 (FIGS. 1A-1F) comprising: a first, here top, electrically conductive member 14 comprising a shape memory alloy, here, for example, Nitinol; a second, here bottom, electrically conductive member 16 comprising a shape memory alloy here, for example, Nitinol; and a dielectric 18 disposed between the first electrically conductive member 14 and the second electrically conductive member 16. The dielectric 18 is a thermally and electrically insulating material. The structure 10 is here a cantilevered structure having a fixed proximal end 20 and a pivotal distal end 22. More particularly, the proximal end 20 is fixed to a dielectric base 24 by three vertically extending structures 26a, 26b, and 26c, as shown. The base 24 has an electrically conductive contact pad 30, as shown.

A first wire 32 is electrically connected to one end of both the top conductive member 14 and the bottom conductive member 16 through the vertically extending conductive structure 26a. Thus, the vertically extending structure 26a is electrically conductive all the way from the wire 32 to a proximal end of both the top conductive member 14 and the bottom conductive member 16. The wire 32, and hence one end of both the top conductive member 14 and the bottom conductive member 16, is grounded.

A second electrical wire 34 is electrically connected to only the bottom conductive member 16 through the vertically extending structure 26b, such vertically extending structure 26b being electrically conductive only to the bottom conductive member 16 because of a proximal portion of the dielectric 18 disposed between a bottom portion of the vertically extending structure 26b and the upper portion of the vertically extending structure 26b. Thus, current fed to wire 34 passes only to the bottom conductive member 16 when the structure 12 is in the position shown in FIG. 1A.

A third electrical wire 40 is connected to a second vertically extending conductive structure 26c. The second vertically extending conductive structure 26c is spaced from the second vertically extending structure 26b along the vertical sides but is connected to the top conductor 14 through a bridging portion 15 formed in the top conductive member 14 as shown. The wire 40 therefore has an end connected only to the top conductive member 14, as shown.

An electrical circuit 50 is provided for applying a current pulse from a current generator 52 through a switch 54 selectively to either the top conductive member 14, to the bottom conductive member 16, or to neither one of the top or bottom conductive members 14, 16 as when the switch 54 is in the position shown in FIGS. 1A, 1C, 1D and 1F. Thus, with the switch 50 in the position shown in FIG. 1B, current passes from the current generator 52 to the switch 50 then to wire 34 then to one end of the bottom conductor 16 then through the bottom conductor 16 to the opposite end of the top conductor 16 to the wire 32 back to the current generator through ground. With the switch 50 in the position shown in FIG. 1E, current passes from the current generator 52 to the switch 50 then to wire 40 then to one end of the top conductor 14 then through the top conductor 14 to the opposite end of the top conductor 14 to the wire 32 back to the current generator through ground.

The process for forming the memory cell is as follows: Having formed the structure 12 as shown (FIG. 1A), the structure 12 is placed in a first position, here the position shown in FIGS. 1A through 1C. Note that in this first position the structure 12 is suspended over the contact pad 30. More particularly, the bottom conductive member 16 is spaced above or therefore not in contact with the contact pad 30. This position corresponds to one of the two logic states.

Figure 1B:
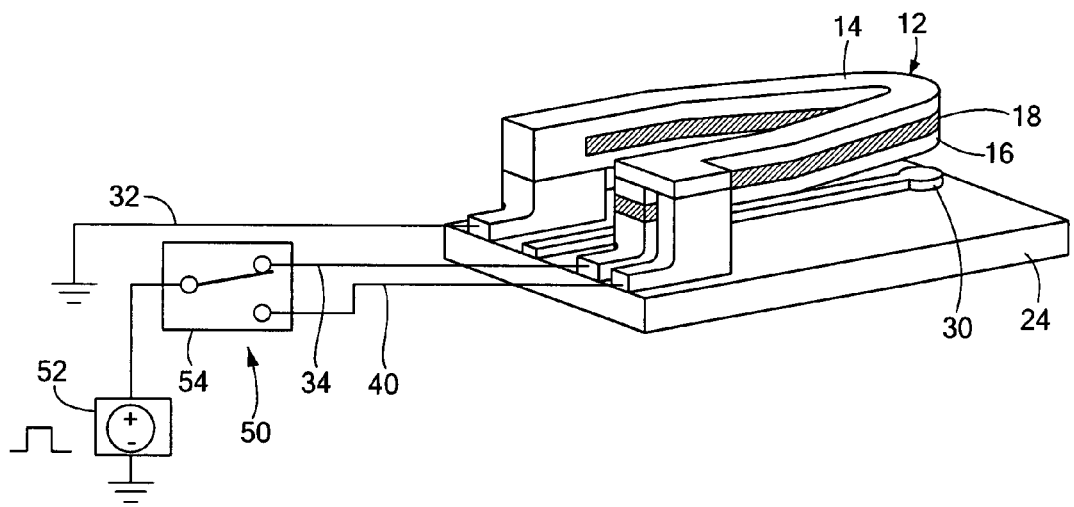

Next, the position of the switch 50 is changed from the position shown in FIG. 1A to the position shown in FIG. 1B. Thus, current is fed from the current generation 52 to only to the bottom electrically conductive member 16 of the structure 12. The applied current heats only the bottom electrically conductive member 16 (because of the dielectric 18 between the top and bottom members 14, 16) while the structure is in the first position. The current is sufficient to heat the conductive member 16 to up to the temperature of austenitic transformation of the alloy used in such member. This process causes the first member to memorize the first position and fix the "parent shape".

Figure 1C:
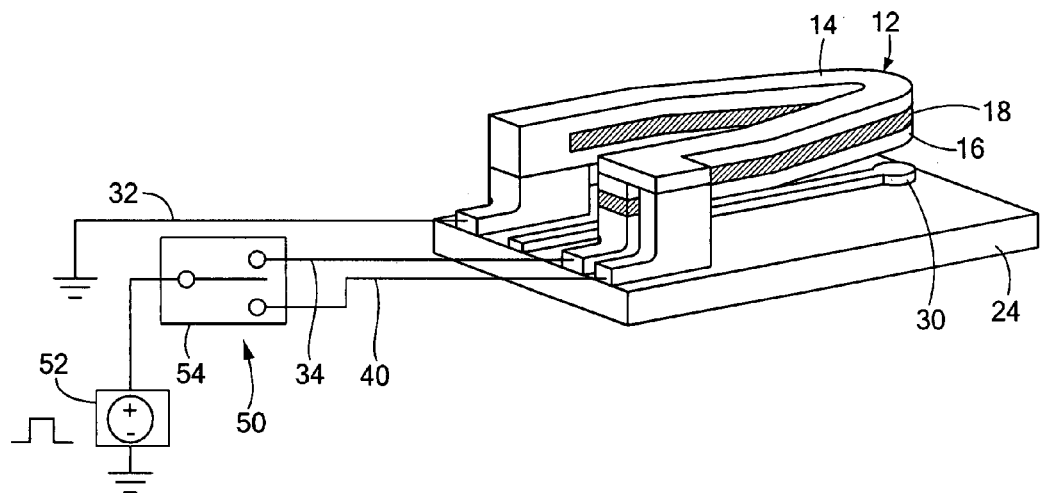

Next, the position of the switch 50 is changed to the original position as shown in FIG. 1C. Thus, the current, and hence the heat applied to the top electrically conductive member 14 is removed.

Figure 1D:
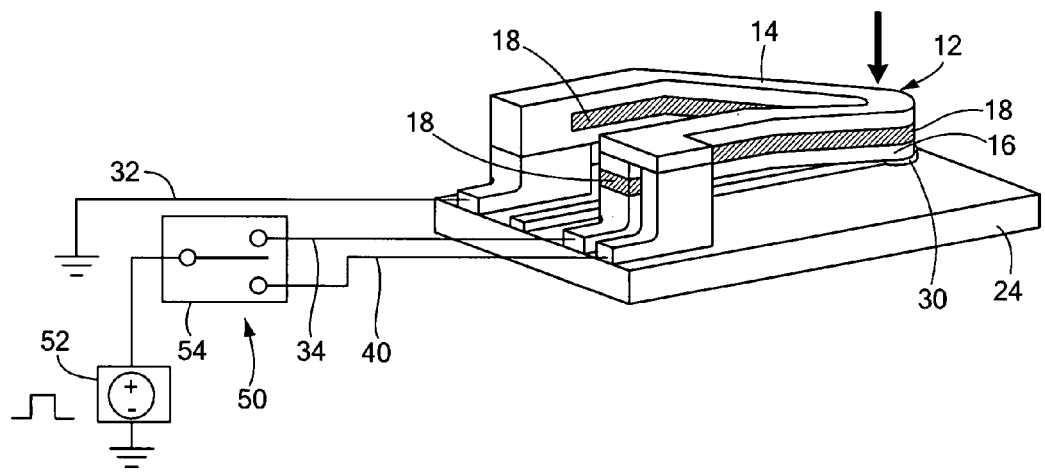
Figure 1E:
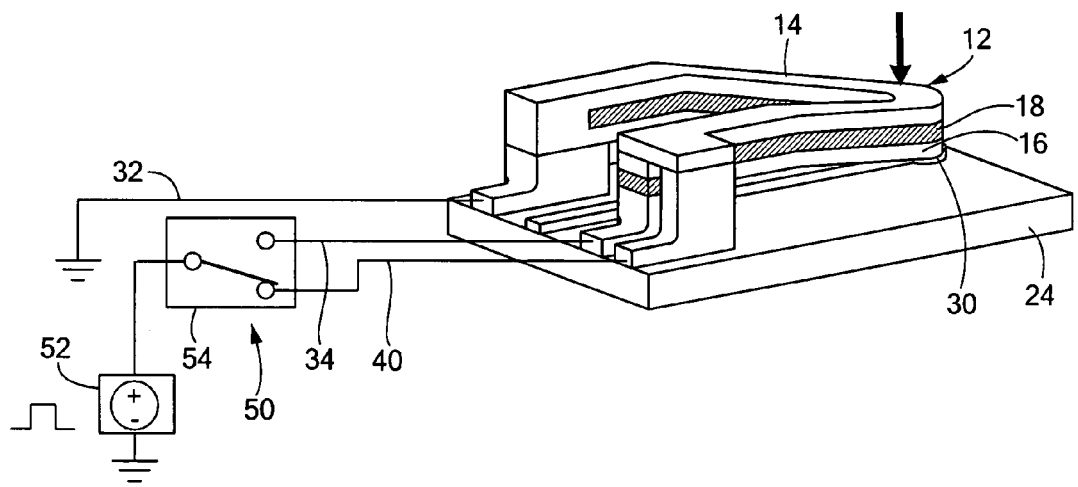

Next, the position of the structure 12 is changed from the first position to a different position corresponding to a second one of the two logic states, as shown in FIG. 1D. More particularly, the distal end portion of the cantilevered structure 12 is physically bent, or pivoted, down so that the bottom of the bottom conductive member 16 physically makes contact with the contact pad 30, as shown in FIG. 1D. The position of switch 50 is changed from the position shown in FIG. 1D to the position shown in FIG. 1E. Thus, current is fed from the current generation 52 to wire 40 and hence only to the top electrically conductive member 14 of the structure 12. The applied current heats only the top electrically conductive member 14 (because of the dielectric 18 between the top and bottom members 14, 16 while the structure 12 is in the second position. The current is sufficient to heat the top conductive member 14 to up to the temperature of austenitic transformation of the alloy used in such member 14.

Figure 1F:
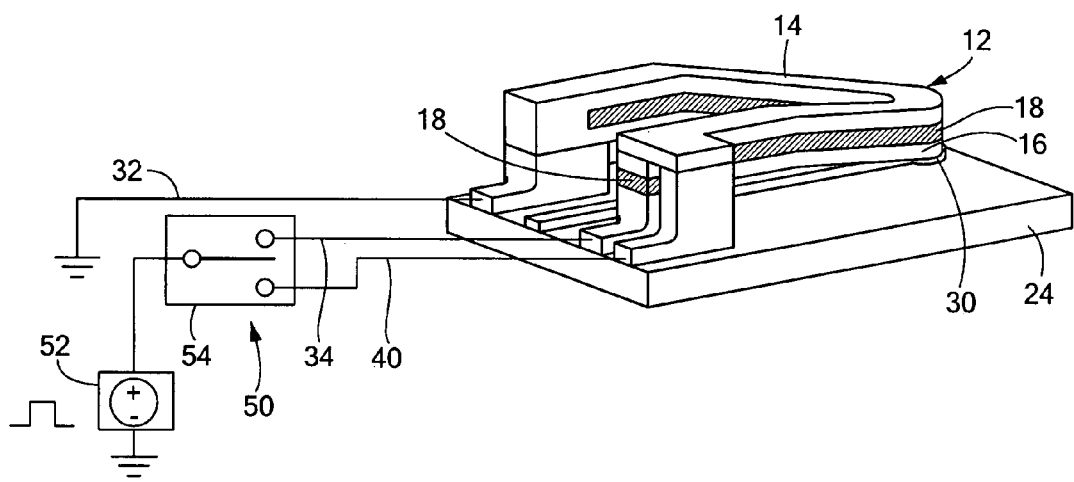

Next, the position of the switch 50 is changed to the original position as shown in FIG. 1F. Thus, the current, and hence the heat applied to the top conductive member 14 is removed. This process causes the top conductive member 14 to memorize the second position.

The process thereby produces a Nitinol based flash memory device 10 having high reliability, especially in high-magnetic and electrostatic environment and free from alpha-particles effect compared with conventional flash memories. Simple design allows to build a 3D memory arrays with extensive, up to 3 Terra-bit per cubic inch, data storage devices.

The produced MEMS memory cell is based on application of cantilever members 14, 16 made from Nitinol or similar alloys with shape memory effect. Thus, the structure 10 has a Nitinol member 14, 16 and a thermo-insulating dielectric layer 18 between them. Nitinol plates are working as actuators when short pulse of electric current is applied and the conductive member 14, 16 is reaching the temperature of austenitic transformation of alloy restoring the "parent shape". When electric current is applied to the top member 14, it is working as an actuator pushing the structure 12 down into the second position until bottom member 16 reaches connection with the contact pad 30 located under the distal end of the structure 12. When electric current is released, the distal end of the structure 12 remains in the bent, or pivoted, down (i.e., second position) position thereby storing (as a non-volatile memory cell) a digital or logic "1". Applying electric pulse to the bottom member 16 moves the structure 12 up to the first position, thereby storing (as a non-volatile memory cell) a digital or logic "0". The time of response is depend on volume of the actuator's members and can be significantly reduced by application of nano-scale design for MEMS memory structures.

Figures 2, 2A:
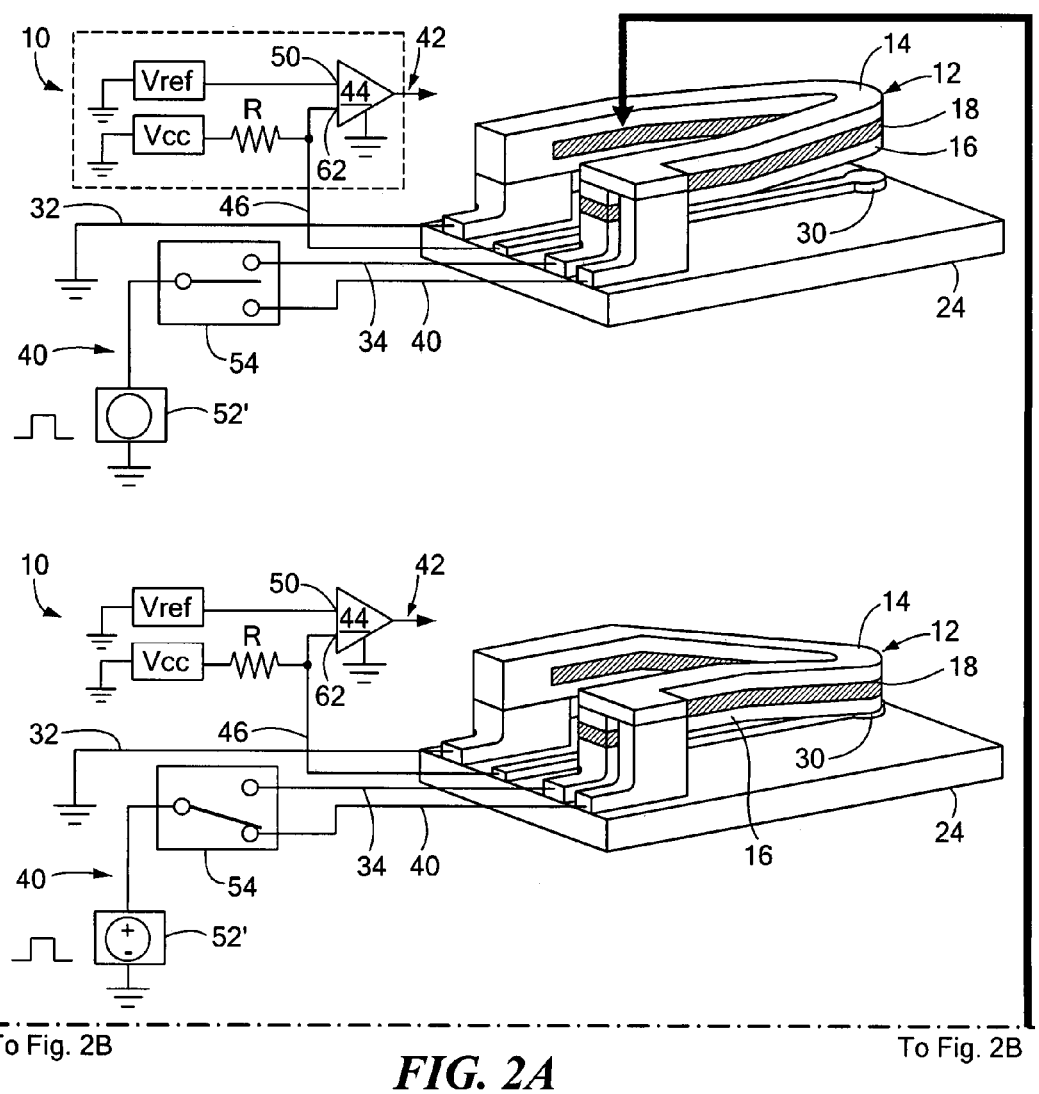
FIG. 2 is a set of sketches illustrating the operation of the memory cell manufactured in accordance with FIGS. 1A-1F.
Figure 2B:
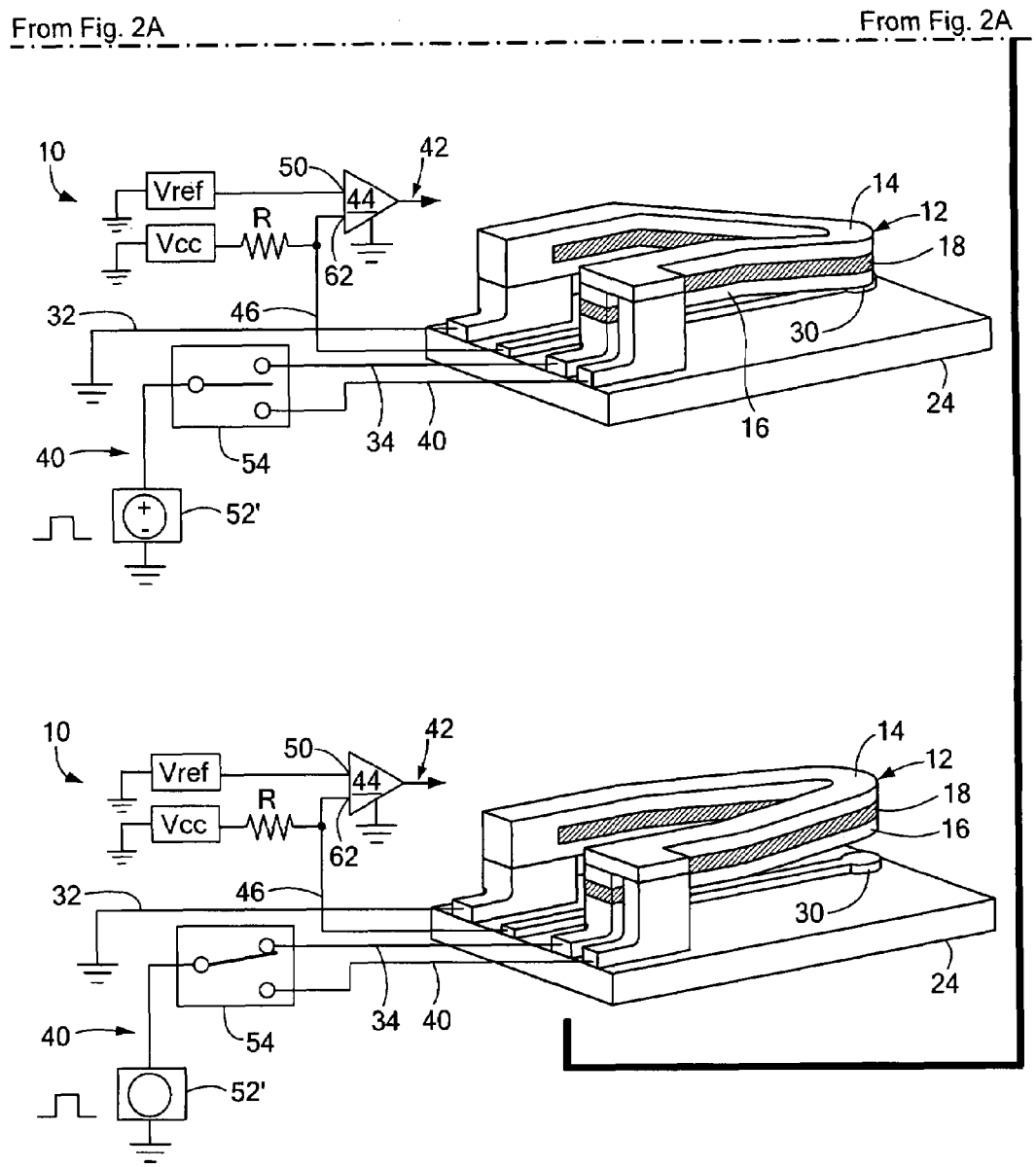

Having produced the structure 12, reference is made to FIG. 2, such FIG. 2 showing the memory cell 10 connected via switch 54 to input circuitry, here a current pulse generator 52' and output circuitry 42. It should be understood that the duration of the current pulses produced by the current pulse generator 52' are shorter than the current pulses produced by the current generator 52 described above in connection with FIGS. 1A-1F. The contact pad 30 is connected to output circuitry 42 through a wire 46. The output circuitry 42 is a sensor for detecting whether the structure 12 is in the first position (where the position of the structure 12, and more particularly the lower member 16, is spaced from the contact pad 30), or in the second position (where the position of the structure 12, and more particularly the lower member 16, is in contact with the contact pad 30). More particularly, the output circuitry 42 here includes a differential amplifier 44 having one input 50 connected to a reference voltage $V_{ref}$ and a second input 62 connected to: a second voltage $V_{cc}$ through a resistor R and also to the contact pad 30 through the wire 46. The output circuitry 44 detects the logic state of the bit stored by the memory cell 10. More particularly, in the absence of current through the contact pad 30 (where the position of the structure 12, and more particularly the lower member 16, is spaced from the contact pad 30) and hence an absence of current through the resistor R, the voltage at the second input 62 of the differential amplifier 44 is relatively high compared with the voltage at the second input 62 of the differential amplifier 44 when current passes through resistor R or in the second position (where the position of the structure 12, and more particularly the lower member 16, is in contact with the contact pad 30).

The upper picture of FIG. 2 shows the cell 10 in the first position thereby storing one logic state, here for example, a logic 0. More particularly, the bottom member 14 is spaced from the contact pad 30 so that there is no current through resistor R. Consequently, the voltage at the second input 62 is relatively high and the output voltage of the differential amplifier 44 represents a logic 0 state.

The next lower picture of FIG. 2 shows the cell 10 having a current pulse produced by the pulse generator 52' applied through switch 54 to the upper conductive member 14 via wire 40 to thereby change the position of the structure 12 from the first position to the second, lower, position whereby the lower conductive member 16 makes physical contact with the contact pad 30. When the lower conductive member 16 makes physical contact with the contact pad 30, current from $V_{cc}$ passes through resistor R through wire 40 to contact pad 30 then to the distal end of the bottom conductive member 16 then through about half of such bottom conductive member 16 to wire 32 and then through $V_{cc}$ via ground. Because current now passes through resistor R, the voltage at the second input 62 of the differential amplifier 44 is reduced, i.e., is relatively low compared with the voltages at the second input 62 in the absence of current through resistor R with the result that the logic state represented by the output of the differential amplifier 44 changes to a logic 1 state. When the current pulse is removed, the structure 12 remains in the bent, or pivoted, down position and the lower conductive member 14 remains in contact with the contact pad 30. Thus, the memory cell 10 is a non-volatile memory cell. With the lower conductive member 16 in contact with contact pad 30, the logic state "1" can be read by the output circuitry, i.e., differential amplifier 44.

The next lower picture of FIG. 2 shows the non-volatile feature of the cell 10 with the structure 12 remaining in the second, lower, position thereby storing the second logic state, here for example, a logic 1 in the absence of the pulse.

The lowest picture of FIG. 2 shows the cell 10 having a current pulse applied to only the lower conductive member 16 to thereby change the position of the structure 12 from the second position back to the first, upper, position thereby storing the first logic state, here for example, a logic 0 since the lower conductive member 16 breaks contact with contact pad 30.

Thus, the top and bottom pictures in FIG. 2 show the memory cell 10 storing a logic 0 and the two middle pictures in FIG. 2 show the memory cell 10 storing a logic 1.

The memory cell allows building memory devices as a 3D CMOS chip. A 3D design approach can significantly increase potential data storage density. For example, building the 3D MEMS memory chip with relatively large dimensions of a single memory assembly of 3 micrometers×5 micrometers×2 micrometers will achieve a data storage density of 3 Terabit per inch$^3$.

A number of embodiments of the invention have been described. Nevertheless, it will be understood that various modifications may be made without departing from the spirit and scope of the invention. For example other output and input circuitry may be used. Accordingly, other embodiments are within the scope of the following claims.

What is claimed is:

1. A memory cell for storing a bit having one of two logic states, comprising:
    a structure comprising:
        a first electrically conductive member comprising a shape memory alloy having a first nominal shape and a first memorized shape;
        a second electrically conductive member comprising a shape memory alloy having a second nominal shape and a second memorized shape, the second memorized shape being different from the first memorized shape;
        a dielectric disposed between and affixed to both the first electrically conductive member and the second electrically conductive member;
    an electrical circuit for:
        applying a current pulse at a first time to the first electrically conductive member with both the first member and the second member being in the first nominal shape and the second nominal shape to drive the first electrically conductive member to the first memorized shape and place the structure is a first position corresponding to one of the two logic states, such first electrically conductive member remaining in the first memorized shape after the termination of the current pulse applied thereto; and
        applying a current pulse at a different time to the second electrically conductive member with both the first member and the second member being in the first nominal shape and the second nominal shape to drive the second electrically conductive member to the second memorized shape to change the position of the structure from the first position to a different position, such different position corresponding to a different one of the two logic states, such second electrically conductive member remaining in the second memorized shape after the termination of the current pulse applied thereto;

output circuitry for detecting the logic state of the bit stored by the memory cell, such output circuitry comprising a position sensor for detecting whether the structure is in the first position or in the second position.

2. The cell recited in claim 1 wherein the structure is a cantilevered structure having a fixed proximal end and a pivotal distal end and wherein the position of the structure is changed by the distal end pivoting between the first position and the different position.

* * * * *